US007704320B2

(12) United States Patent
Marr et al.

(10) Patent No.: US 7,704,320 B2
(45) Date of Patent: Apr. 27, 2010

(54) COLLOIDAL CRYSTALLIZATION VIA APPLIED FIELDS

(75) Inventors: David W. M. Marr, Golden, CO (US); Tieying Gong, Golden, CO (US); David Wu, Golden, CO (US)

(73) Assignee: Colorado School of Mines, Golden, CO (US)

( * ) Notice: Subject to any disclaimer, the term of this patent is extended or adjusted under 35 U.S.C. 154(b) by 0 days.

(21) Appl. No.: 10/838,908

(22) Filed: May 3, 2004

(65) Prior Publication Data

US 2005/0022723 A1   Feb. 3, 2005

Related U.S. Application Data

(60) Provisional application No. 60/467,750, filed on May 1, 2003.

(51) Int. Cl.
 *C30B 30/04* (2006.01)
(52) U.S. Cl. ................................. 117/68; 117/925
(58) Field of Classification Search ............... 117/68, 117/925, 926, 927, 11, 62
See application file for complete search history.

(56) References Cited

U.S. PATENT DOCUMENTS

| 5,002,647 A * | 3/1991 | Tanabe et al. ............. 204/484 |
| 5,021,224 A * | 6/1991 | Nakajima ................... 117/213 |
| 5,098,850 A * | 3/1992 | Nishida et al. .............. 438/62 |
| 5,176,786 A * | 1/1993 | Debe ......................... 117/105 |
| 5,753,038 A * | 5/1998 | Vichr et al. .................. 117/97 |
| 5,855,753 A * | 1/1999 | Trau et al. .................. 204/484 |
| 6,017,390 A * | 1/2000 | Charych et al. .............. 117/68 |
| 6,055,106 A * | 4/2000 | Grier et al. ................. 359/566 |
| 6,128,006 A * | 10/2000 | Rosenberg et al. ......... 345/163 |
| 6,187,089 B1 * | 2/2001 | Phillips et al. .............. 117/13 |
| 6,406,903 B2 * | 6/2002 | Bray et al. ............... 435/235.1 |
| 6,468,346 B2 * | 10/2002 | Arnowitz et al. ............. 117/68 |
| 6,533,903 B2 * | 3/2003 | Hayward et al. ........ 204/157.15 |
| 6,797,057 B1 * | 9/2004 | Amos et al. .................. 117/68 |
| 6,893,502 B2 * | 5/2005 | Papadimitrakopoulos et al. ........................... 117/92 |
| 2002/0062783 A1 * | 5/2002 | Bray .......................... 117/68 |
| 2003/0024470 A1 * | 2/2003 | Myerson ..................... 117/68 |

OTHER PUBLICATIONS

Lumsdon et al, Two-Dimensional Crystalliation of Microspheres by a Coplanar AC Electric Field, Feb. 14, 2004, American Chemical Society. Langmuir 2004, 20, 2108-2116.*

* cited by examiner

*Primary Examiner*—Yogendra Gupta
*Assistant Examiner*—Emmanuel S Luk
(74) *Attorney, Agent, or Firm*—Sheridan Ross P.C.

(57) ABSTRACT

The methods provided use external fields such as light and electricity as a means of directing the crystallization of concentrated colloidal systems. Not only can nucleation be directed, crystal melting can be carefully controlled and light-induced crystal diffraction used as a means of directing light propagation. A number of factors play a significant role on the crystallization rate and location, including the intensity of the light field, the magnitude of the electric field, the colloid concentration, the colloid size, and the colloid composition. In varying these parameters, kinetics in these processes are extremely fast when compared to traditional colloidal crystallization approaches.

13 Claims, 7 Drawing Sheets

COLLOIDAL CRYSTALLIZATION VIA APPLIED FIELDS

CROSS REFERENCE TO RELATED APPLICATION

This application claims priority to U.S. Provisional Patent Application Ser. No. 60/467,750, filed May 1, 2003 which is incorporated herein in its entirety by this reference.

STATEMENT OF GOVERNMENT INTEREST

This invention was made with Government support from the National Science Foundation (NSF) under Grant Nos. CTS-0097841 and CTS-0304158. The Government has certain rights in the invention.

FIELD OF THE INVENTION

The present invention relates to methods of forming three-dimensional crystals of colloid-sized matter that uniquely employ external fields as well as devices useful in these methods.

BACKGROUND OF THE INVENTION

Depending on the nature of the interactions between individual particles, colloids will form a surprising variety of morphologies. For strongly attracting systems, for example, they will irreversibly aggregate into fractal structures. In the opposite case of strongly repelling particles, similar systems will undergo an entropically-driven disorder to order transition forming colloidal crystals whose structure depends on the range of the repulsion. One of the technologically most compelling properties of these crystals is their ability to diffract visible light, a direct result of the length scales associated with these systems. Because of this characteristic and the ability of colloids to self-assemble, a number of researchers have attempted to take advantage of their optical properties for photonic applications, including photonic band gap materials and diffraction-based sensors.

A number of significant limitations however have slowed the development of colloidal crystal-based devices. The first is the difficulty in uncoupling particle-particle interactions, which is conventionally altered by modifying colloidal surface chemistry or solution properties, from the resulting crystal structure. Second, the structures that are created are not reversible over convenient time scales; colloidal crystals can take weeks to form. In addition, once formed, these crystals can be exceedingly fragile. Because they are typically created through long-range Coulombic interactions they can have lattice spacings several times their diameter and any shear can destroy them. Attempts to create stable crystals whose spacings can be varied with time or condition have hitherto focused on locking in the structure using a matrix that can expand or contract in response to an environmental stimulus.

For many desired applications however, the ability to reversibly create crystals is desirable. Applications such as color displays in which individual pixels must be switched is one example. To date, efforts to create reversible crystals have focused on two-dimensional systems in the context of electrodeposition, where it has been shown that applied AC or DC electric fields will induce ordering in two dimensions. The fields induce a strong attraction between particles causing a rapid aggregation into two-dimensional ordered domains. The effective interactions are due to electro-kinetic flows induced by the applied electric fields and the presence of the colloids. In the DC field case, the effect is dominated by electroosmosis and in the AC field case electrohydrodynamics dominate.

A general and efficient crystallization method is also desired in the field of protein chemistry and molecular modeling. This need is particularly acute due to the completion of the human genome project which has opened up new methods for understanding the fundamental biological processes of life. After determining all the genetic codes, the primary task of the post-genomic era is to understand the functions of the gene products—namely proteins—in cells and organisms. Proteins carry out essential functions in living organisms, and protein malfunction leads to a number of human diseases. A better understanding of the function of cellular proteins will therefore lead to the development of effective approaches for disease prevention and cure.

There are currently many approaches for studying the biological function of cellular proteins. One of the most powerful involves relating three-dimensional protein structure to its function. Protein structure determination can provide direct insight into how the protein works in a cell. Crystal structures at atomic resolution not only provide insight into the biological functions of proteins, but also allow the structure-based drug design of inhibitors or stimulators for regulating the functions of target proteins with known structures. As a result, universities and pharmaceutical companies are investing heavily in structural biology to determine the crystal structure of biologically important proteins.

Currently the most critical step in the determination of protein structure is the creation of a protein crystal in order to collect x-ray diffraction data. Protein crystallography has now advanced to the stage that, as long as a diffracting protein crystal is available, the structure for that protein can be determined. Therefore, the current bottleneck in determining protein crystal structure lies within the protein crystallization step.

Currently, there is no perfect methodology for growing protein crystals. Prediction of crystallization behavior is difficult because each protein behaves differently, requiring extensive efforts to screen hundreds and even thousands of conditions for a particular protein before it can be determined if the protein is crystallizable. Normally, the success rate of obtaining protein crystals is approximately 20-30%. Even for those proteins that produce crystals, months or even years of hard work can be required. Thus, a general and efficient method to crystallize any protein or any class of proteins would revolutionize structural biology and molecular medicine. Such a method would dramatically speed up the rate of structural determination of important protein targets and greatly reduce the costs associated with the crystallization process.

SUMMARY OF THE INVENTION

In the methods of the present invention geometries of moderate confinement and external fields are used to quickly and reversibly create compact fully three-dimensional colloidal crystals with excellent optical properties. In these methods, crystal formation is fully reversible. Upon removal of the field, these ordered structures melt into an isotropic colloidal suspension. Upon reapplication of the field, crystals quickly reform. These crystals are mechanically quite stable and also exhibit excellent optical properties, diffracting visible light with the differing crystal orientations visible. In one aspect of the present invention these methods can be used to reversibly manipulate light using relatively inexpensive colloidal materials. In another aspect of the present invention these methods are used for crystallization of proteins that cannot be crystallized via standard approaches.

The methods of the present invention use electric fields to reversibly induce colloidal crystallization from isotropic colloidal suspensions. These methods rely on the application of an electric field across a narrow gap filled with a concentrated colloidal suspension. At gap widths significantly larger than the colloid, lateral variations in electric field are used to induce dielectrophoresis and the reversible formation of three-dimensional ordered colloidal crystals.

In another aspect of the present invention, light is used as a means of directing the crystallization of concentrated colloidal systems in the presence of an electric field. Using these methods, nucleation can be directed, crystal melting can be carefully controlled and light-induced crystal diffraction can be used as a means of directing light propagation. A number of factors play a significant role on the crystallization rate and location, including the intensity of the light field, the magnitude of the electric field, the colloid concentration, the colloid size, and the colloid composition. In varying these parameters, it is possible to obtain process kinetics that are extremely fast when compared to traditional colloidal crystallization approaches.

DETAILED DESCRIPTION

The methodology of the present invention employs external fields to control the three-dimensional crystallization of colloidal-sized matter. These methods take advantage of lateral inhomogeneities in the applied fields to direct the nucleation of the three-dimensional crystals.

One embodiment of the present invention provides a method of forming a colloidal crystal by applying an electric field to a moderately confined colloidal suspension. Without intending to be bound by a single theory, this novel methodology appears to rely on a combination of induced dipole interactions and hydrodynamic flows to create close-packed, mechanically-stable crystals. The transport of the particles is diffusive in nature, but driven by an electric field-induced attraction. Because the effective interactions can be moderated using the applied field, colloidal particles having a wide size range can be crystallized. For example, the ordering of particles having a diameter of between about 200 nm and about 450 nm has been directed through the selective application of the electric field to induce nucleation.

The method may be modified to vary the means of nucleating the crystals. For example, the crystals may be nucleated using gas or bubbles formed in solution or by manipulation of the spatial pattern of the electric field strength. Additionally, the crystals may be nucleated using a static object present in contact with the colloidal suspension. Once initiated, these crystals grow isotropically, independent of the means used for nucleation. This occurs due to dielectrophoretic concentration of colloid particles set up by the strong lateral gradient in the electric field arising from the interface between regions of high and low dielectric constant, creating nuclei and initiating growth.

Figure 5:
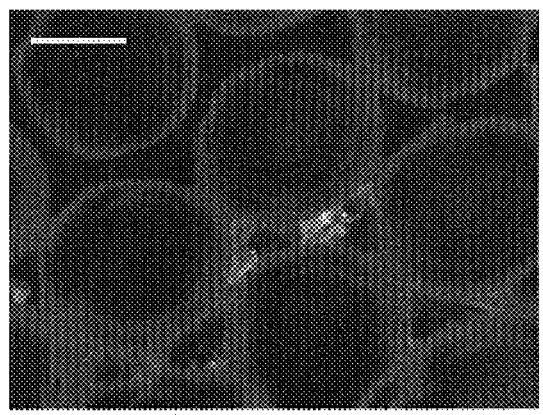
FIG. 5 demonstrates the use of electric field variation for crystal nucleation. In this image, circular regions of one ITO electrode were removed using acid etching and photolithographic methods. Once the resulting patterned ITO electrode was incorporated into the cell and upon field application of 12V 150 Hz and 9 μm electrode spacing, crystals rapidly formed in the regions between etched circles; upon removal of the field the system returned to its original homogenous state. Scale bar=100 μm.
Figure 6:
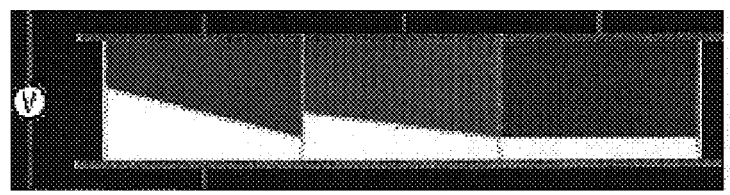
FIG. 6 illustrates one method for directing crystalline orientation. In this, one or both electrodes are physically modified to induce crystal growth in a specified direction.
Figure 7:
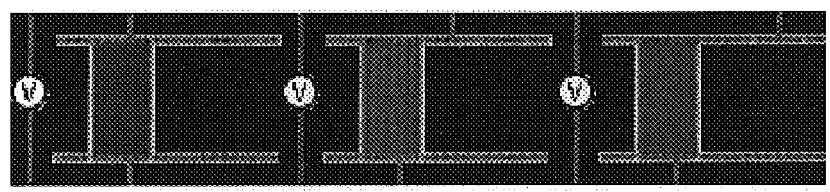
FIG. 7 illustrates another method for directing crystalline orientation. In this, the field is oriented relative to the surface to direct crystal growth in a specified direction.
Figure 8:
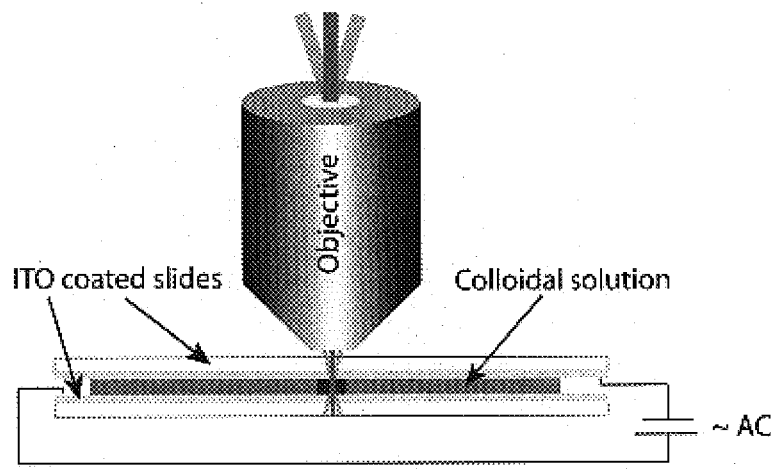
FIG. 8 illustrates a cell for the application of an electric field across a colloidal suspension.

The electric field may be modified or varied during formation of the colloid crystal. By this means, the range, strength and sign of effective interactions can be independently controlled and colloidal lattice morphology varied. Variations in the electric field may be induced by many means. For example, the variations may be induced by an applied light source (illustrated in FIG. 10) or by the use of electrodes (illustrated in FIG. 5).

Figure 1:
FIG. 1 illustrates, in cross section, the application of an electric field across a colloidal suspension. Also shown is the approximate dimension of an example, crystallizable colloid.

A method of reversibly forming colloidal crystals by application of an electric field to a moderately confined colloidal suspension is schematically illustrated in FIG. 1. The applied electric field is then lowered or removed causing the colloidal crystal to melt into an isotropic colloidal suspension. This process can be repeated with the same colloidal suspension by again reapplying the electric field thereby reforming the colloidal crystal.

Figure 2:
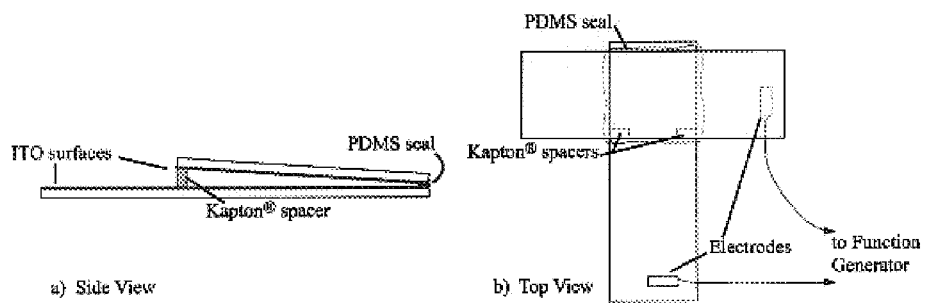
FIG. 2 illustrates one design for applying the required electric fields. a) Side view; b) Top view.
Figure 3:
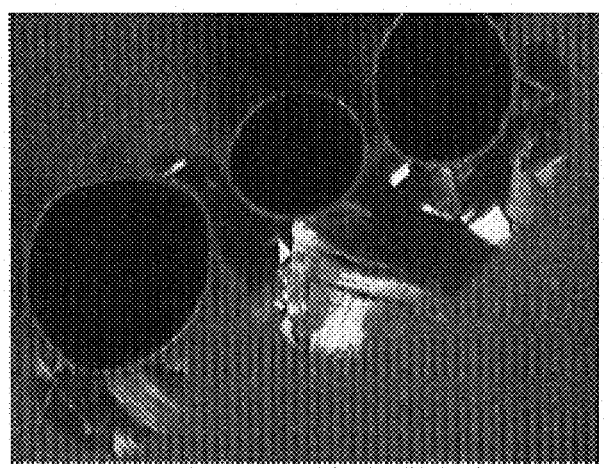
FIG. 3 demonstrates the creation of colloidal crystals using the device of FIG. 1. In this, 300 nm colloidal polystyrene (volume fraction φ~0.20) are ordered through application of a 12 V peak to peak, 150 Hz AC voltage and viewed at low magnification using crossed polarizing filters (the dark areas are air bubbles). The sample cell was created using ITO coated slides spaced approximately 8 microns apart.
Figure 4:
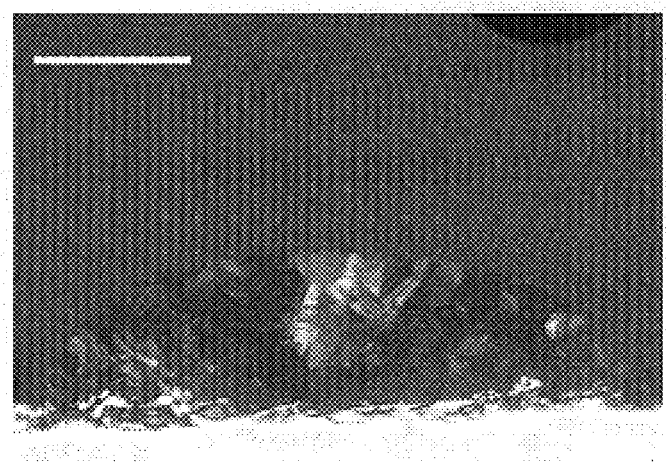
FIG. 4 demonstrates the use of a static object for crystal nucleation. In this example, a thin polymer region consisting of a 7.5 μm thick Kapton® film is incorporated within the cell and used as a nucleating site. Shown here are 300 nm colloids under 12 V, 150 Hz applied field and 9 μm electrode spacing. Scale bar=100 μm.

An apparatus that can be used to form colloidal crystals in a confined colloidal suspension is illustrated in FIG. 2. The design illustrated in this figure uses a wedge cell of very slight angle to create a variety of cell thicknesses within one experimental system. Two indium-tin oxide (ITO)-coated glass slides are placed, conductive sides facing, with a spacer of about 12.5 μm between them at one end creating a cell whose thickness varies by approximately 0.5 μm/mm. Poly(dimethylsiloxane) (PDMS) can then be cured around the slides to seal the edges together leaving a chamber of air with an inlet and outlet for sample insertion. Sample solution is subsequently added to the cell via syringe and more PDMS used to seal the solution inside. The sample is then illuminated from below and viewed between crossed polarizing filters to observe the crystal-induced diffraction.

Figure 9:
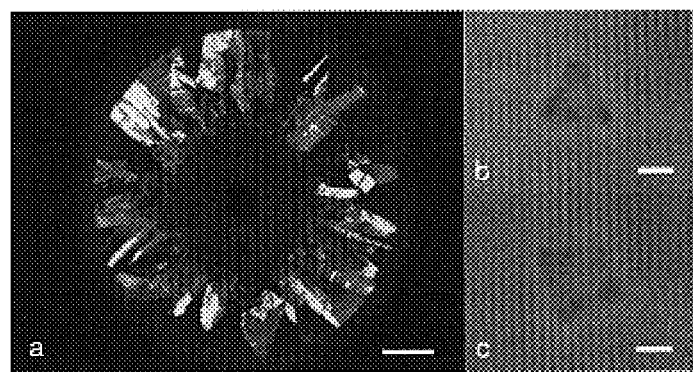
FIG. 9 shows colloidal crystals formed through exposure to light. In this image, circular regions of the electrode have been exposed to UV radiation for about 30 minutes during electric field application.

Recent investigations into the two-dimensional patterning of colloidal systems on electrode surfaces have shown that UV radiation can influence the current distribution at an electrode surface (Hayward et al., *Nature* 404:56 (2000)). This can be used in the methods of the present invention to influence the electric field-induced assembly of colloidal particles in aqueous suspensions at the electrode. By varying the spatial intensity of the applied radiation using a mask, templating of the surface with colloidal particles is achieved. Combining this optical technique with the three-dimensional colloidal crystallization methods of the present invention, the ordering process can be modified to induce fully three-dimensional colloidal crystallization in specific and pre-designed regions. For example, FIG. 9a shows the crystal resulting from the use of a mask that allows UV radiation to pass through a circular aperture to illuminate a highly concentrated polystyrene dispersion. Nucleation is induced through such selective electrode illumination and subsequent crystal growth progresses rapidly.

Because of the reversible nature of the crystallization process, a reconfigurable light source, allows for variation of the resulting structures with time. Thus, in another embodiment of the present invention, a laser that can be scanned in variable patterns is used to control the shape of the colloidal crystals. This laser scanning approach enables the creation of arbitrary time-averaged light patterns that are easily controllable and variable with time. Examples of this technique are shown in FIGS. 9b and 9c where a triangular and square pattern have been scanned resulting in the formation of a colloidal crystal of corresponding shape.

Figure 10:
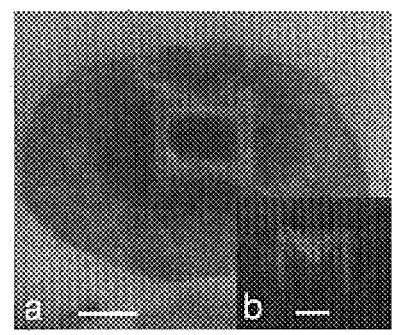
FIG. 10 shows defects created in colloidal crystals composed of 300 nm polystyrene through laser melting.

The primary goal of photonic band gap development is the precise, switchable, and lossless control of light propagation at smaller and smaller length scales. The ability to create optically-functional crystals rapidly and in specific, desired locations will aid practical device development, however, the difficulty in creating controlled and designed defects within these materials in order to direct the flow of light will be necessary in the creation of future photonic band gap devices. For example, line defects could be used as waveguides and point defects as optical microcavities. One advantage of the methods of the present invention that use light to control the nucleation of the colloidal crystals is that the light can also serve to melt crystals that have already been formed. This is illustrated in FIG. 10 in which a square defect pattern was "written" into a colloid crystal initially nucleated with the same laser. These defects are simply melted crystals which anneal with time after removal of the laser radiation. Such a reversible approach to highly-structured crystal nucleation provides a route to erasable and reconfigurable microscale waveguides and other adaptive photon directing applications.

Figure 11:
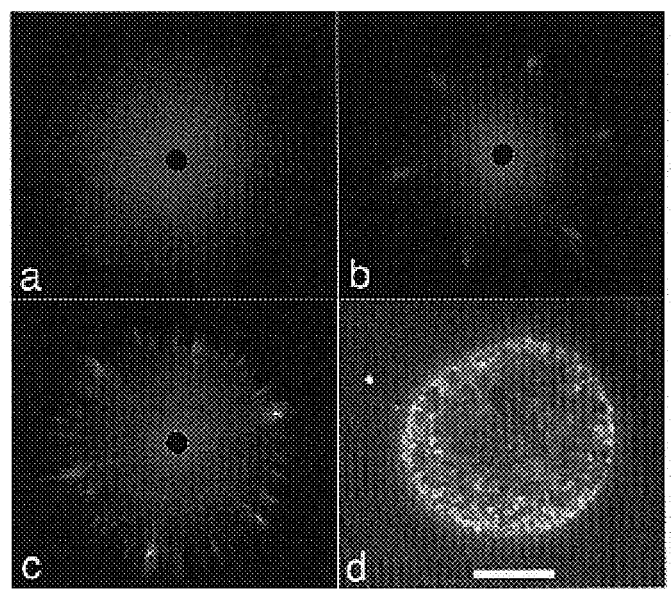
FIG. 11 demonstrates light-induced diffraction in a concentrated colloidal silica suspension under applied electric field.

Although photonic band gap materials will likely find initial application as optical switches, the eventual goal, in analogy with the electrical transistors, is the development of light-directing devices that are controlled optically. Not only could such devices lead to all-optical and significantly faster communications, they could aid the development of photon-based computing. The colloidal systems of the present invention perform exactly in this fashion under electric field. For example, by passing a slightly-focused laser through the system in a transmission geometry, FIG. 11 shows the resulting scattering patterns and the evolution of structure within the sample upon illumination. Initially isotropic (FIG. 11a) and indicating a homogenous, disordered sample, single crystals (FIG. 11b) rapidly form as indicated by the peaks in the scattering pattern. The symmetry in this pattern is consistent with fcc (111) planes oriented against the cell walls with peak positions indicating a close-packed structure. As time proceeds, a large number of additional crystals form as apparent from additional peaks in the scattering pattern (FIG. 11c) and a ring at very small scattering angle (not visible in FIG. 11). This is confirmed in FIG. 1d where the sample was quickly transferred to a microscope and imaged under high magnification. After laser illumination is removed, the crystals decay within a few minutes, with or without continued electric-field application. This shows that a probing laser can turn on crystallization and the corresponding diffraction to redirect light at an angle controlled by the size of the colloid used as well as the incident photon wavelength. Other wavelengths such as the commercially important infrared region could also be used for switching in this fashion.

EXAMPLES

Example 1

This example illustrates an experimental cell used to demonstrate the controlled colloidal crystallization methods of the present invention. Two indium-tin oxide (ITO) coated glass slides, 3 inches by 1 inch, were first coated with Triton® X-100 then placed, conductive sides facing, with a Kapton® spacer of 12.5 µm between them at one end and creating a cell whose thickness varies approximately 0.5 µm/mm. Poly(dimethylsiloxane) (PDMS) was cured around the slides to seal the edges together leaving a chamber of air with an inlet and outlet for sample insertion. Sample solution was added to the cell via syringe and more PDMS was used to seal the solution inside. As purchased, carboxyl-coated polystyrene colloids or hydroxyl-covered silica colloids were centrifuged to high concentration and prepared in a DI-water/KCl solution of final ionic strength 0.001 M, neutral pH and volume fraction approximately 20%. Each solution consisted of approximately 0.5 wt % Triton® X-100.

Electric fields were applied to the cell via wire connection to a function generator operating at 150 Hz with all voltages given as peak to peak. Samples were viewed under crossed polarizers typically in regions of 10 µm gap width. For laser scanning, a rapidly translated piezoelectric mirror was used to reflect the laser (532 nm, Spectra Physics Millenia 5, operated typically between 0.2 W and 0.5 W) in a desired pattern.

Example 2

This example demonstrates the production of colloidal crystals using the methods of the present invention. A 20 vol % polystyrene colloid 300 nm in diameter was exposed to an electric field of 15 V and approximately 1 mW UV radiation. FIG. 9a shows the colloidal crystal under subsequent microscope illumination. The different colors indicate polycrystallinity and are caused by the differing orientation of individual crystallites relative to the plane of incident light polarization. Crystals were then formed from a 20 vol % dispersion of 330 nm diameter colloidal silica with an applied 12 V, nucleated via 0.4 W laser scanning in triangle and square patterns shown in FIGS. 9b and 9c respectively. Scale bars=25 µm.

Example 3

This example demonstrates the method of defect creation in a colloidal crystal. Defects were created in colloidal crystals composed of 300 nm polystyrene through laser melting (scanned laser power at 0.4 W). The defects are shown in FIG. 10 in the form of a) a square and b) the letter "M". Defect annealing after removal of the laser radiation in these systems can vary from 30 s to approximately 10 minutes. Scale bars=25 μm.

Example 4

This example demonstrates light-induced diffraction by the colloidal crystals of the present invention. FIG. 11 shows small angle light scattering (SALS), by a concentrated 20 vol % 700 nm diameter colloidal silica suspension under 15 V applied electric field a) upon initial laser exposure (0.8 W) b) after formation of single crystals, and c) at later times with multiple crystals present. FIG. 11d shows the crystal under a microscope immediately after removal from SALS illumination. Scale bar=100 μm.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, are within the scope of the present invention. The embodiment described hereinabove is further intended to explain the best mode known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A method of forming a colloidal crystal comprising applying radiation to modify an electric field external to a suspension of particles in a liquid to create a lateral gradient in the electric field that sets up a dielectrophoretic concentration of colloid particles in the suspension causing the formation of three-dimensional colloidal crystals of the particles in the suspension.

2. The method of claim 1, wherein the radiation is selected from the group consisting of ultraviolet light and visible light.

3. The method of claim 1, wherein gas in the suspension of particles serves as a nucleation site for the initial growth of the colloidal crystals from the dielectrophoretic concentration of particles.

4. The method of claim 1, wherein at least one bubble in the suspension of particles serves as a nucleation site for the initial growth of the colloidal crystals from the dielectrophoretic concentration of particles.

5. The method of claim 1, wherein the radiation is applied to the suspension of particles in a spatial pattern that creates a nucleation site for the initial growth of the colloidal crystals from the dielectrophoretic concentration of particles.

6. The method of claim 1, wherein the suspension of particles further comprises a static object that creates a nucleation site for the initial growth of the colloidal crystals from the dielectrophoretic concentration of particles.

7. The method of claim 1, wherein the particles have a size range between about 20 nm and about 5 μm.

8. The method of claim 1, wherein particles are protein molecules.

9. The method of claim 1, comprising the additional step of removing the radiation applied to the suspension of particles to cause dissolution of the colloidal crystal.

10. The method of claim 9, wherein the colloidal crystal is only partly dissolved by removal of the radiation.

11. The method of claim 1, wherein the radiation applied is oriented relative to a surface of the suspension of particles to direct growth of the three-dimensional colloidal crystals in a specific direction.

12. A method of forming a colloidal crystal comprising:
applying an electric field external to a suspension of particles in a liquid to establish an assembly of colloidal particles on an electrode in the suspension; and,
applying radiation to modify the electric field to create a lateral gradient in the electric field that sets up a dielectrophoretic concentration of colloid particles surrounding an assembly of colloidal particles on the electrode to template the surface of the electrode with colloidal particles to induce three-dimensional colloidal crystallization in specific regions of the electrode.

13. The method of claim 12, wherein the radiation is applied to the assembly of colloidal particles on the electrode through a mask.

* * * * *